United States Patent
Li et al.

(10) Patent No.: US 10,961,848 B2
(45) Date of Patent: Mar. 30, 2021

(54) UNIDIRECTIONAL MAGNETIZATION OF NUCLEAR MAGNETIC RESONANCE TOOLS HAVING SOFT MAGNETIC CORE MATERIAL

(71) Applicant: Halliburton Energy Services, Inc., Houston, TX (US)

(72) Inventors: Lilong Li, Houston, TX (US); Songhua Chen, Katy, TX (US); Arcady Reiderman, Richmond, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 15/753,421

(22) PCT Filed: Sep. 29, 2017

(86) PCT No.: PCT/US2017/054386
§ 371 (c)(1),
(2) Date: Feb. 19, 2018

(87) PCT Pub. No.: WO2019/066919
PCT Pub. Date: Apr. 4, 2019

(65) Prior Publication Data
US 2020/0217192 A1    Jul. 9, 2020

(51) Int. Cl.
*E21B 49/00* (2006.01)
*G01N 24/08* (2006.01)
(Continued)

(52) U.S. Cl.
CPC ........... *E21B 49/00* (2013.01); *G01N 24/081* (2013.01); *G01V 3/32* (2013.01)

(58) Field of Classification Search
None
See application file for complete search history.

(56) References Cited

U.S. PATENT DOCUMENTS 3,597,681 A    8/1971  Huckabay et al.
5,828,214 A   10/1998  Taicher et al.
(Continued)

FOREIGN PATENT DOCUMENTS

WO    WO 2003/071301 A1    8/2003

OTHER PUBLICATIONS

International Search Report and the Written Opinion of the International Search Authority, or the Declaration, dated Jan. 5, 2018, PCT/US2017/054386, 17 pages, ISA/KR.
(Continued)

*Primary Examiner* — Jermele M Hollington
(74) *Attorney, Agent, or Firm* — Haynes and Boone, LLP

(57) ABSTRACT

NMR tools are described having unidirectional magnetization throughout the magnet assembly. An antenna assembly is positioned around the magnet assembly in order to excite a volume in the surrounding subterranean formation. A layer of soft magnetic core material is positioned under the antenna assembly in order to shield all or most of the RF field generated by the RF antenna away from the conductive components inside the NMR tool. The conductive components may be conductive structural members or a conductive magnet assembly. The soft magnetic core material also shapes the static magnetic field by smoothing out the longitudinal magnetic field variation.

16 Claims, 12 Drawing Sheets

(51) Int. Cl.
   *G01N 3/32*   (2006.01)
   *G01V 3/32*   (2006.01)

(56) References Cited

U.S. PATENT DOCUMENTS

| | | | |
|---|---|---|---|
| 5,959,453 | A | 9/1999 | Taicher et al. |
| 6,008,646 | A | 12/1999 | Griffin et al. |
| 6,118,272 | A | 9/2000 | Taicher et al. |
| 6,121,773 | A | 9/2000 | Taicher et al. |
| 6,181,132 | B1 | 1/2001 | Runia |
| 6,362,619 | B2 * | 3/2002 | Prammer ................ G01V 3/32 |
| | | | 324/303 |
| 6,586,932 | B1 | 7/2003 | Taherian et al. |
| 7,733,086 | B2 * | 6/2010 | Prammer ................ G01V 3/32 |
| | | | 324/303 |
| 7,834,622 | B2 | 11/2010 | Reiderman et al. |
| 9,377,557 | B2 * | 6/2016 | Reiderman .......... G01N 24/081 |
| 9,784,881 | B2 * | 10/2017 | Jachmann ............... E21B 47/00 |
| 10,197,698 | B2 * | 2/2019 | Reiderman .............. G01V 3/32 |
| 10,422,915 | B2 * | 9/2019 | Jachmann ........... G01N 24/081 |
| 10,768,334 | B2 * | 9/2020 | Jachmann ................ G01V 3/32 |
| 2002/0125885 | A1 | 9/2002 | Reiderman et al. |
| 2002/0175681 | A1 | 11/2002 | Taicher |
| 2009/0072825 | A1 | 3/2009 | Prammer et al. |
| 2015/0061664 | A1 * | 3/2015 | Reiderman .............. G01V 3/32 |
| | | | 324/303 |
| 2015/0061665 | A1 * | 3/2015 | Reiderman .............. G01V 3/32 |
| | | | 324/303 |
| 2017/0003413 | A1 * | 1/2017 | Jachmann ............... E21B 47/00 |
| 2017/0010378 | A1 * | 1/2017 | Reiderman .......... G01R 33/383 |

OTHER PUBLICATIONS

Xiao et al., "Development of an NMR System for Down-Hole Porous Rocks", *Microporous and Mesoporous Materials*, 2015, vol. 205, pp. 16-20.

* cited by examiner

UNIDIRECTIONAL MAGNETIZATION OF NUCLEAR MAGNETIC RESONANCE TOOLS HAVING SOFT MAGNETIC CORE MATERIAL

PRIORITY

The present application is a U.S. National Stage patent application of International Patent Application No. PCT/US2017/054386, filed on Sep. 29, 2017, the benefit of which is claimed and the disclosure of which is incorporated herein by reference in its entirety.

FIELD OF THE DISCLOSURE

The present disclosure relates generally to nuclear magnetic resonance ("NMR") tools and, more specifically, to NMR tools having unidirectional magnet assemblies with a layer of soft magnetic core material positioned there around.

BACKGROUND

In the field of logging (e.g., wireline logging, logging while drilling ("LWD") and measurement while drilling ("MWD")), NMR tools have been used to explore the subsurface based on the magnetic interactions with subsurface material. Some downhole NMR tools include a magnet assembly that produces a static magnetic field, and a coil assembly that generates radio frequency ("RF") control signals and detects magnetic resonance phenomena in the subsurface material. Properties of the subsurface material can be identified from the detected phenomena.

Conventional NMR tools have disadvantages. For example, one conventional NMR configuration provides an annular cylindrical sensitive volume and generates a magnetic field substantially in a longitudinal direction in the sensitive volume. Here, there exists a significant limitation in that the magnet needs to be non-conductive (i.e., generally be RF transparent) and, thus, generally limited to the use of ferrite material. The remnant flux density of the ferrite material is not as strong as recently developed rare earth magnetic material, so in order to achieve the same magnetic field, a lot more ferrite material is needed which leaves significantly less room to maintain mechanical integrity. Also, ferrite material has a ringing problem which limits how low one can get with TE, the inter-echo spacing (or Time between Echos), which is an important NMR logging parameter. In LWD applications, a relatively large cross section is required for structural components to maintain strength in demanding drilling operation, and such structural components are inevitably metallic and conductive. Under such drilling conditions, conventional NMR configurations become infeasible.

DESCRIPTION OF ILLUSTRATIVE EMBODIMENTS

Figure 1A:
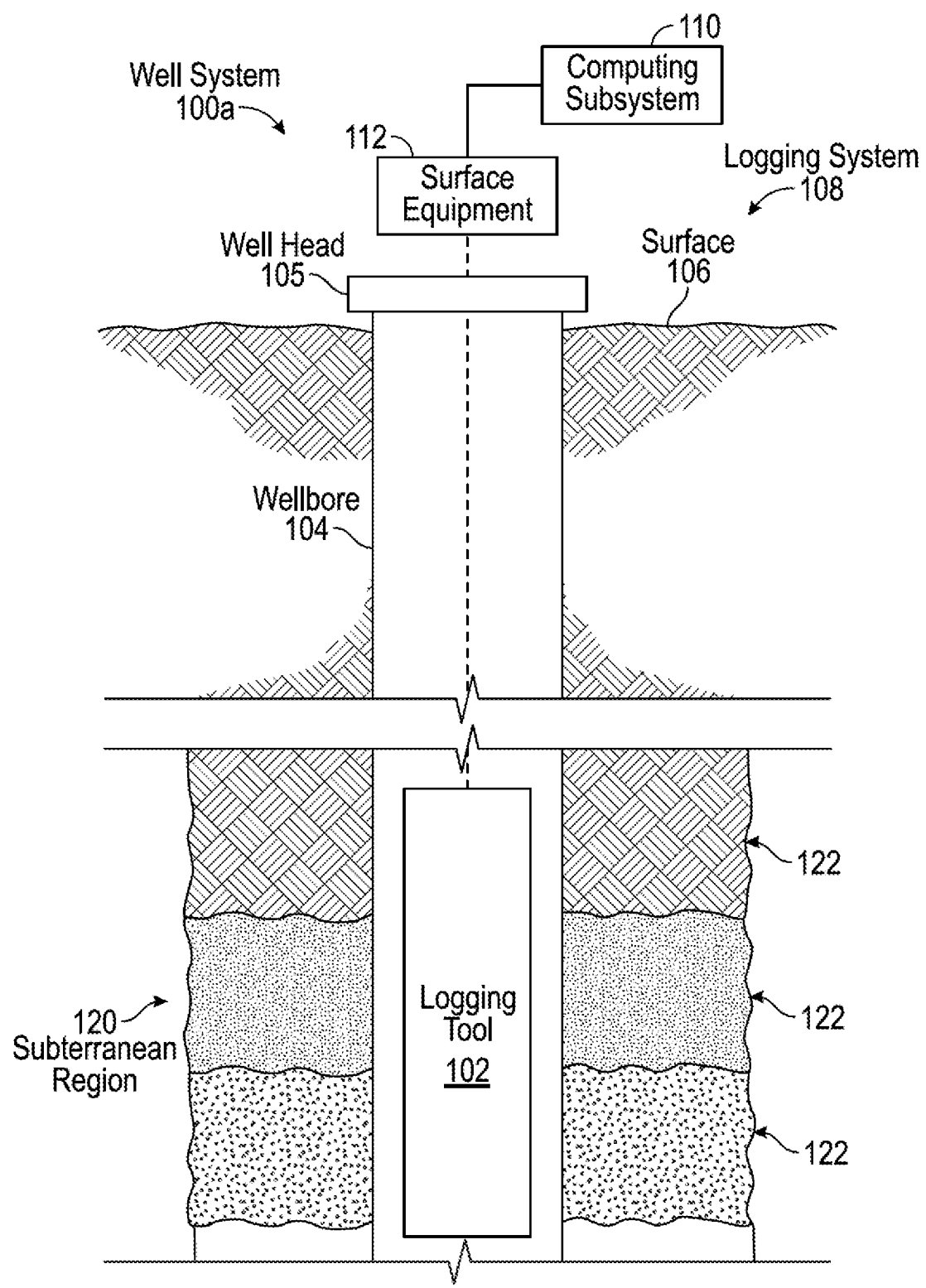
FIG. 1A is a diagram of an example well system.

Illustrative embodiments and related methods of the present disclosure are described below as they might be employed in NMR tools having magnet assemblies with unidirectional magnetization and soft magnetic core material there around. In the interest of clarity, not all features of an actual implementation or method are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure. Further aspects and advantages of the various embodiments and related methods of the disclosure will become apparent from consideration of the following description and drawings.

As described herein, illustrative embodiments and methods of the present disclosure are directed to NMR tools with a unidirectional magnetization throughout the magnet assembly. The magnet assembly may be comprised of one or more magnets which produce a static magnetic field, each magnet having a magnetization direction in one longitudinal direction throughout the magnet assembly. This unidirectional magnetization provides rotational symmetry which is especially suitable for LWD. Compared to conventional designs, the unidirectional design of the present disclosure has a longer sensitive volume which enables logging while tripping. The magnetic field gradient is also higher than conventional designs, so it is more stable against magnetic material property variation and temperature variation. Moreover, the unidirectional design may use an antenna configuration that minimizes borehole loss in a lossy mud environment.

An antenna assembly is positioned around the magnet assembly in order to excite a volume in the surrounding subterranean formation. A layer of soft magnetic core material (e.g., magnetic sleeve) is positioned under the antenna assembly in order to shield all or most of the RF field generated by the RF antenna away from the conductive components inside the NMR tool. The conductive components may be conductive structural members or a conductive magnet assembly. The soft magnetic core material also shapes the static magnetic field by smoothing out the longitudinal magnetic field variation, a very desirable outcome.

As previously mentioned, one disadvantage of certain conventional NMR tools is they are limited to the use of non-conductive magnets made of ferrite material. The non-conductive magnets are used to produce a static magnetic field substantially in the longitudinal direction in the sensitive volume of the subterranean region. Since the remnant flux density of the ferrite material is not as strong as recently developed rare earth magnetic materials, much more ferrite material is needed, which leaves significantly less room to maintain mechanical integrity. In addition, the ferrite material has a ringing problem which limits how low one can get with inter-echo spacing, which is an important NMR logging parameter. Moreover, in LWD applications a relatively large cross section is required for structural components to maintain strength in demanding drilling operations, and such structural components are inevitably metallic and conductive. Therefore, the use of such NMR designs in such applications, especially drilling applications, is very difficult, if not impossible.

Accordingly, the illustrative embodiments of the present disclosure overcomes these limitations through use of a layer of soft magnetic core material under the antenna assembly. As described herein, "soft" magnetic core material are those materials which are easily magnetized and demagnetized, and typically have an intrinsic coercivity of less than 1000 A/m (ampere/meter units). The layer of soft core material may be embodied in a variety of ways such as, for example, a magnetic sleeve or a layer of soft core material placed on a drill collar or other tubular. The soft magnetic core material will shield most or all of the RF field generated by the RF antenna (e.g., coil) away from the conductive components inside. As mentioned above, the conductive components can be conductive structure members of the NMR tool itself or a conductive magnet assembly. Moreover, the soft magnetic core material also shapes the static magnetic field by smoothing out the longitudinal magnetic field variation, an even more desirable outcome.

Moreover, the embodiments disclosed herein provide magnet assemblies having one or more magnets magnetized in the same longitudinal direction and placed all together. In certain embodiments, the magnet cross-sectional area towards the center of the magnet assembly is larger, or the remnant flux of the magnetic material used is larger, or a combination thereof. In yet other embodiments, the magnet cross-sectional area towards the center of the magnet assembly is smaller, or the remnant flux of the magnetic material used is smaller, or a combination thereof. The manipulation of the cross-sectional areas of both embodiments assists in shaping the static magnetic field such that it is smoothed out along the longitudinal direction. Furthermore, the design of the NMR tools described herein provides the benefit that the magnet assembly is much shorter than conventional NMR designs—a very desirable feature in LWD applications because a shorter tool is much easier to turn along the space-constrained wellbore.

In some implementations, an illustrative NMR instrument can offer practical solutions for obtaining NMR data from the subsurface. In some instances, the instrument can provide a higher signal-to-noise ratio ("SNR") (e.g., for a given DC power budget), motional immunity, azimuthal selectivity of measurements, or a combination of these or other advantages. In some cases, the instrument can be robust against environmental factors, and provide accurate or precise information for analysis of the subsurface.

In some other illustrative embodiments, an NMR instrument can produce a longitudinal static magnetic field in the volume of interest. In some examples, the instrument includes multiple transversal-dipole antennas (e.g., two identical transversal-dipole antennas) that produce circular polarized excitation and provide quadrature coil detection. An arrangement of multiple orthogonal antennas can be used, for example, with a longitudinal-dipole magnet that generates an axial static magnetic field in the volume of interest. In some examples, the instrument includes a multiple-volume arrangement that makes use of different regions of the magnet assembly to acquire the NMR signal. In some examples, a region of investigation has a shape that is suitable for measurements while tripping the drill string (i.e., transiting the drill string in the wellbore). Some example implementations include a combination of a transversal-dipole antenna axially-symmetrical response and a monopole antenna axially-symmetrical response, which can enable azimuthally-resolved unidirectional NMR measurements in some instances.

Various features of the illustrative NMR tools described herein may be combined, as would be understood by those ordinarily skilled in the art having the benefit of this disclosure. These and other advantages of the present disclosure will be apparent to those same skilled artisans.

FIG. 1A is a diagram of an example well system 100a. The example well system 100a includes an NMR logging system 108 and a subterranean region 120 beneath the ground surface 106. A well system can include additional or different features that are not shown in FIG. 1A. For example, the well system 100 a may include additional drilling system components, wireline logging system components, etc.

The illustrative subterranean region 120 can include all or part of one or more subterranean formations or zones. The example subterranean region 120 shown in FIG. 1A includes multiple subsurface layers 122 and a wellbore 104 penetrated through the subsurface layers 122. The subsurface layers 122 can include sedimentary layers, rock layers, sand layers, or combinations of these and other types of subsurface layers. One or more of the subsurface layers can contain fluids, such as brine, oil, gas, etc. Although the example wellbore 104 shown in FIG. 1A is a vertical wellbore, the NMR logging system 108 can be implemented in other wellbore orientations. For example, the NMR logging system 108 may be adapted for horizontal wellbores, slanted wellbores, curved wellbores, vertical wellbores, or combinations of these.

The example NMR logging system 108 includes a logging tool 102, surface equipment 112, and a computing subsystem 110. In the example shown in FIG. 1A, the logging tool 102 is a downhole logging tool that operates while disposed in the wellbore 104. The example surface equipment 112 shown in FIG. 1A operates at or above the surface 106, for example, near the well head 105, to control the logging tool 102 and possibly other downhole equipment or other components of the well system 100. The example computing subsystem 110 can receive and analyze logging data from the logging tool 102. An NMR logging system can include additional or different features, and the features of an NMR logging system can be arranged and operated as represented in FIG. 1A or in another manner.

In some instances, all or part of the computing subsystem 110 can be implemented as a component of, or can be integrated with one or more components of, the surface equipment 112, the logging tool 102 or both. In some cases, the computing subsystem 110 can be implemented as one or more computing structures separate from the surface equipment 112 and the logging tool 102.

In some implementations, the computing subsystem 110 (i.e., processing circuitry) is embedded in the logging tool 102, and the computing subsystem 110 and the logging tool 102 can operate concurrently while disposed in the wellbore 104. For example, although the computing subsystem 110 is shown above the surface 106 in the example shown in FIG. 1A, all or part of the computing subsystem 110 may reside below the surface 106, for example, at or near the location of the logging tool 102.

The well system 100a can include communication or telemetry equipment that allows communication among the computing subsystem 110, the logging tool 102, and other components of the NMR logging system 108. For example, the components of the NMR logging system 108 can each include one or more transceivers or similar apparatus for wired or wireless data communication among the various components. For example, the NMR logging system 108 can include systems and apparatus for optical telemetry, wireline telemetry, wired pipe telemetry, mud pulse telemetry, acoustic telemetry, electromagnetic telemetry, or a combination of these and other types of telemetry. In some cases, the logging tool 102 receives commands, status signals, or other types of information from the computing subsystem 110 or another source. In some cases, the computing subsystem 110 receives logging data, status signals, or other types of information from the logging tool 102 or another source.

NMR logging operations can be performed in connection with various types of downhole operations at various stages in the lifetime of a well system. Structural attributes and components of the surface equipment 112 and logging tool 102 can be adapted for various types of NMR logging operations. For example, NMR logging may be performed during drilling operations, during wireline logging operations, or in other contexts. As such, the surface equipment 112 and the logging tool 102 may include, or may operate in connection with drilling equipment, wireline logging equipment, or other equipment for other types of operations.

Figure 2A:
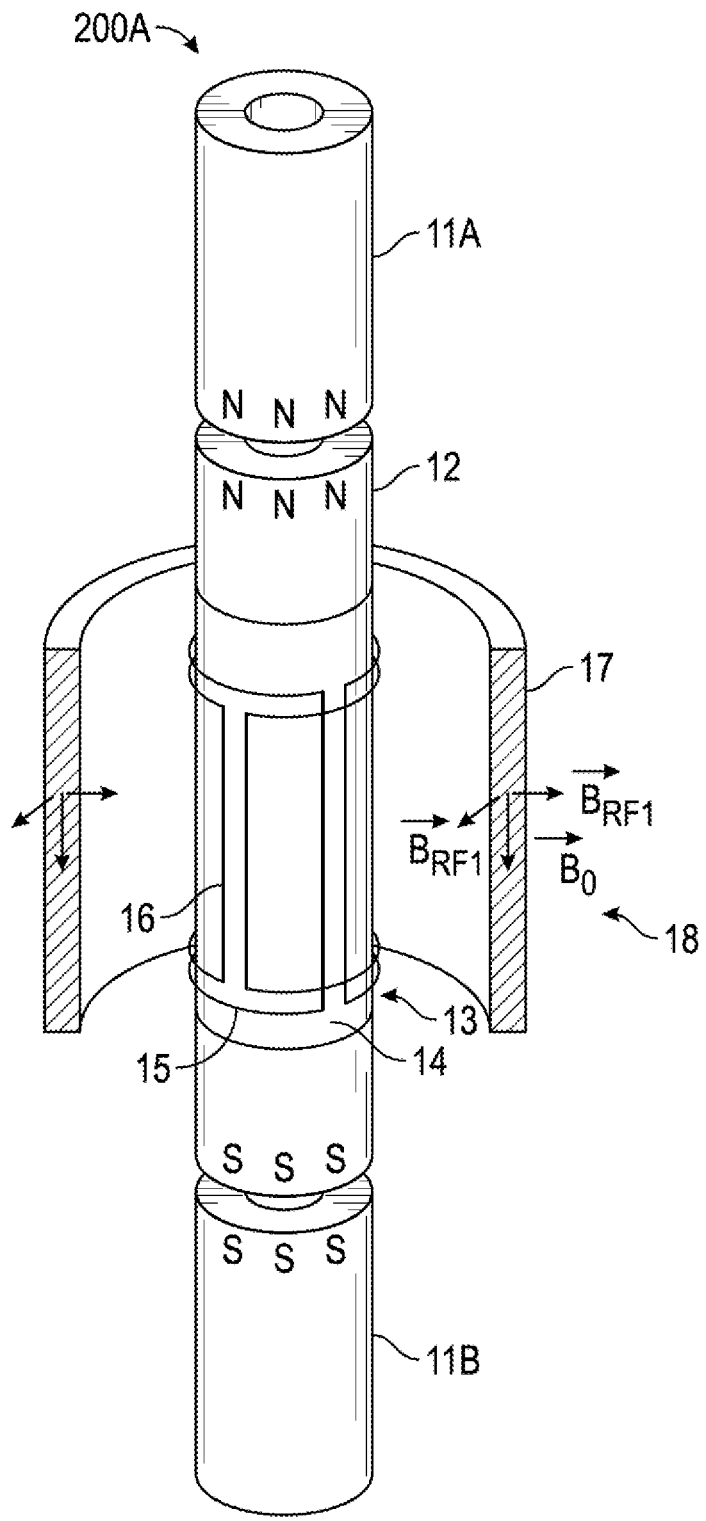
FIG. 2A is a diagram of an example downhole tool for obtaining NMR data from a subterranean region.
Figure 2B:
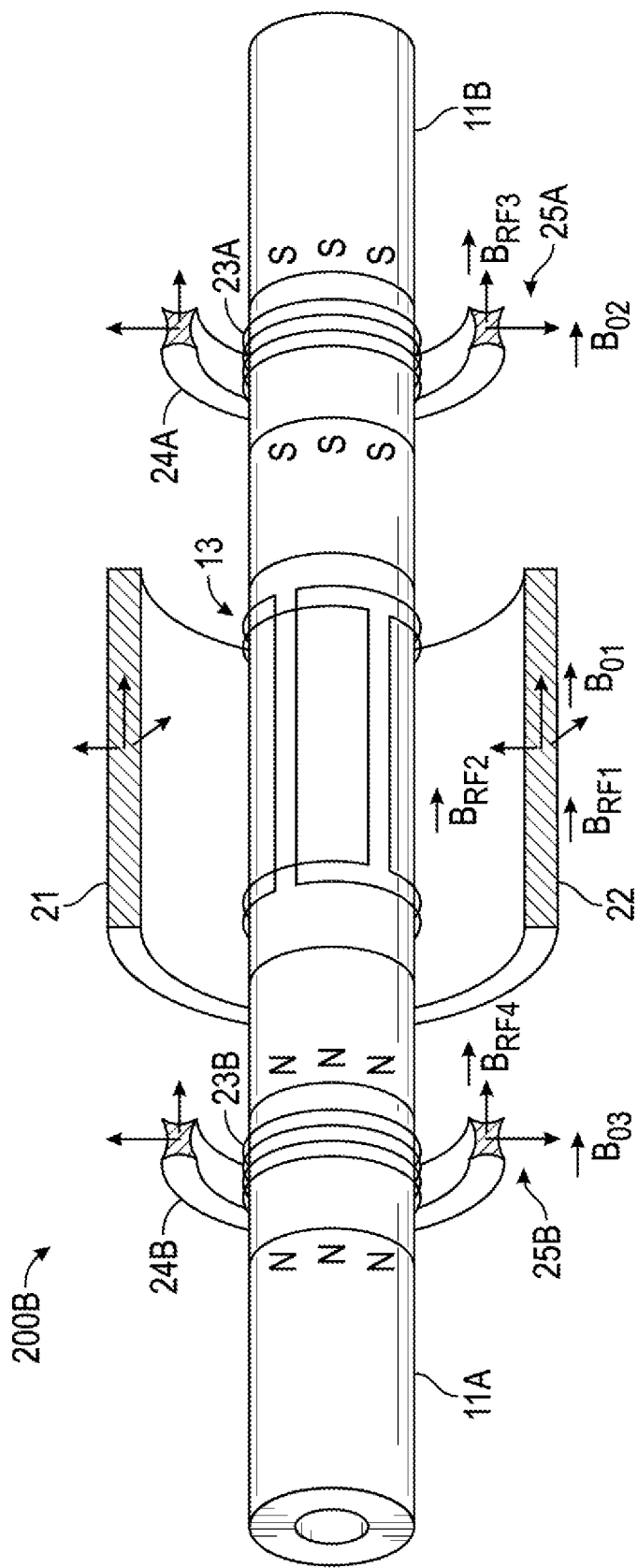
FIG. 2B is a diagram of another example downhole tool for obtaining NMR data from a subterranean region.

In certain illustrative embodiments, the logging tool 102 includes a magnet assembly that includes a central magnet and two end piece magnets. Examples are shown in FIGS. 2A, 2B, and 3B. The end piece magnets can be spaced apart from the axial ends of the central magnet. The end pieces together with the central magnets can define four magnetic poles, which may be arranged to enhance the static magnetic field in a volume of interest. In some cases, the central magnet defines a first magnetic field orientation, and the end piece magnets define a second magnetic field orientation that is orthogonal to the first magnetic field orientation. The logging tool 102 can also include multiple orthogonal transversal-dipole antennas. The orthogonal transversal-dipole antennas can produce circular polarized excitation in a subterranean volume and acquire a response from the volume by quadrature coil detection.

In some implementations, the logging tool 102 includes a magnet assembly that produces a magnetic field in multiple distinct sub-volumes in the subterranean region 120. An example is shown in FIG. 2B. A first sub-volume can be an elongate cylindrical-shell region that extends in the longitudinal direction (parallel to the wellbore axis), and the magnetic field in the first sub-volume can be substantially uniformly oriented along the longitudinal direction. Second and third sub-volumes can be spaced apart from the axial ends of the first sub-volume, and the static magnetic field in the second and third sub-volumes can have a radial orientation (perpendicular to the longitudinal direction). The second and third sub-volumes can be located at a different distance from the center of the tool string than the first volume. In some instances, the locations of the second and third sub-volumes allow the logging tool to collect information for mud filtrate invasion profiling. The logging tool 102 can also include multiple antenna assemblies at respective locations along the longitudinal axis. Each of the antenna assemblies can detect an NMR response from a respective one of the distinct sub-volumes.

In some implementations, the logging tool 102 includes a magnet assembly and a transversal-dipole and monopole antenna assembly. An example is shown in FIG. 3B. The transversal-dipole and monopole antenna assembly can obtain a unidirectional azimuthally-selective NMR response from a subterranean volume about the magnet assembly. The transversal-dipole and monopole antenna assembly can include orthogonal transversal-dipole antennas and a monopole antenna.

Figure 1B:
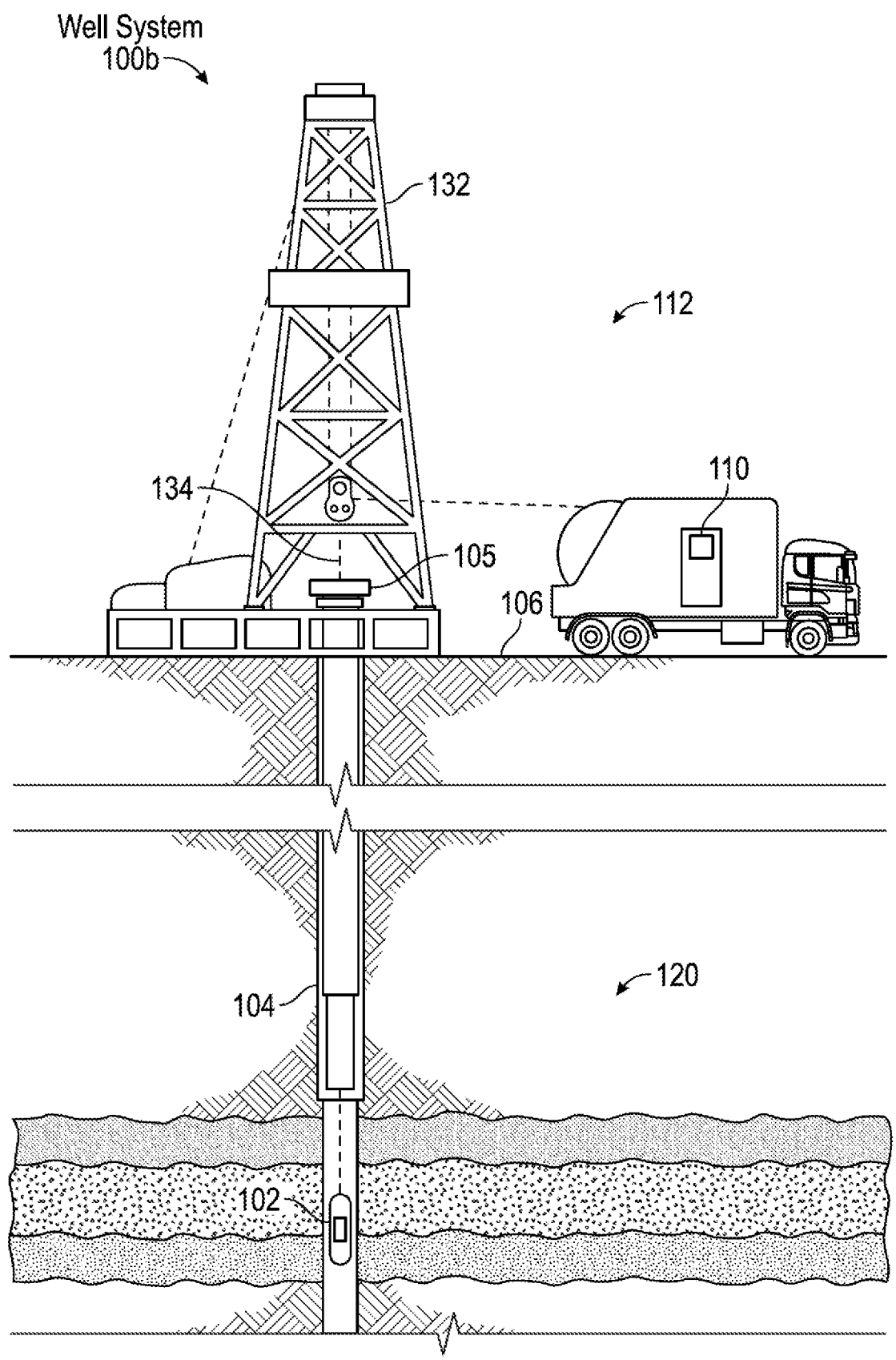
FIG. 1B is a diagram of an example well system that includes an NMR tool in a wireline logging environment.

In some examples, NMR logging operations are performed during wireline logging operations. FIG. 1B shows an example well system 100b that includes the logging tool 102 in a wireline logging environment. In some example wireline logging operations, the surface equipment 112 includes a platform above the surface 106 equipped with a derrick 132 that supports a wireline cable 134 that extends into the wellbore 104. Wireline logging operations can be performed, for example, after a drill string is removed from the wellbore 104, to allow the wireline logging tool 102 to be lowered by wireline or logging cable into the wellbore 104.

Figure 1C:
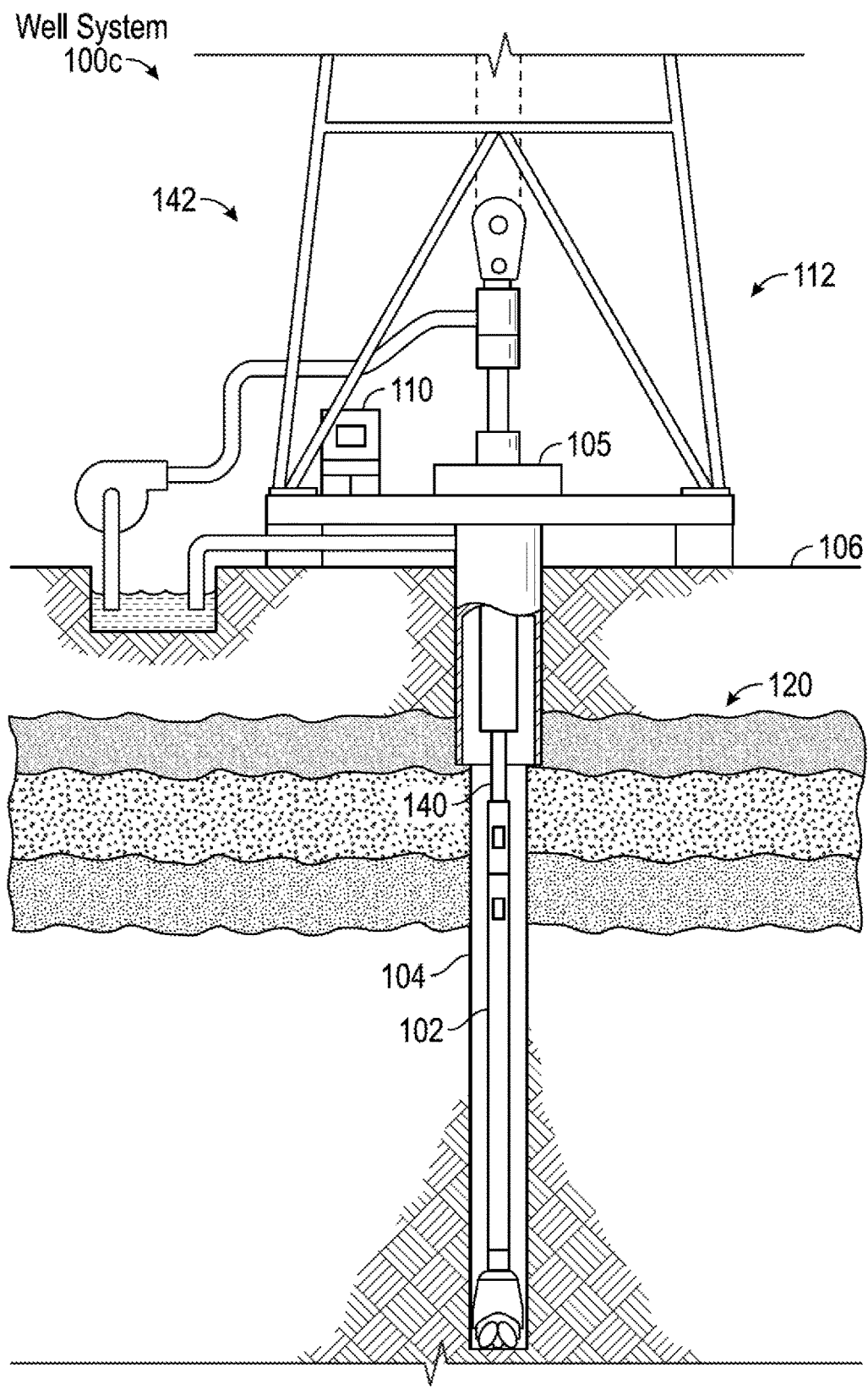
FIG. 1C is a diagram of an example well system that includes an NMR tool in a logging while drilling (LWD) environment.

In some examples, NMR logging operations are performed during drilling operations. FIG. 1C shows an example well system 100c that includes the logging tool 102 in an LWD environment. Drilling is commonly carried out using a string of drill pipes connected together to form a drill string 140 that is lowered through a rotary table into the wellbore 104. In some cases, a drilling rig 142 at the surface 106 supports the drill string 140, as the drill string 140 is operated to drill a wellbore penetrating the subterranean region 120. The drill string 140 may include, for example, a kelly, drill pipe, a bottomhole assembly, and other components. The bottomhole assembly on the drill string may include drill collars, drill bits, the logging tool 102, and other components. The logging tools may include MWD tools, LWD tools, and others.

In some implementations, the logging tool 102 includes an NMR tool for obtaining NMR measurements from the subterranean region 120. As shown, for example, in FIG. 1B, the logging tool 102 can be suspended in the wellbore 104 by a coiled tubing, wireline cable, or another structure that connects the tool to a surface control unit or other components of the surface equipment 112. In some example implementations, the logging tool 102 is lowered to the bottom of a region of interest and subsequently pulled upward (e.g., at a substantially constant speed) through the region of interest. As shown, for example, in FIG. 1C, the logging tool 102 can be deployed in the wellbore 104 on jointed drill pipe, hard wired drill pipe, or other deployment hardware. In some example implementations, the logging tool 102 collects data during drilling operations as it moves downward through the region of interest. In some example implementations, the logging tool 102 collects data while the drill string 140 is moving, for example, while it is being tripped in or tripped out of the wellbore 104.

In some implementations, the logging tool 102 collects data at discrete logging points in the wellbore 104. For example, the logging tool 102 can move upward or downward incrementally to each logging point at a series of depths in the wellbore 104. At each logging point, instruments in the logging tool 102 perform measurements on the subterranean region 120. The measurement data can be communicated to the computing subsystem 110 for storage, processing, and analysis. Such data may be gathered and analyzed during drilling operations (e.g., during LWD operations), during wireline logging operations, or during other types of activities.

The computing subsystem 110 can receive and analyze the measurement data from the logging tool 102 to detect properties of various subsurface layers 122. For example, the computing subsystem 110 can identify the density, viscosity, porosity, material content, or other properties of the subsurface layers 122 based on the NMR measurements acquired by the logging tool 102 in the wellbore 104.

In some implementations, the logging tool 102 obtains NMR signals by polarizing nuclear spins in the subterranean region 120 and pulsing the nuclei with a RF magnetic field. Various pulse sequences (i.e., series of radio frequency pulses, delays, and other operations) can be used to obtain NMR signals, including the Carr Purcell Meiboom Gill ("CPMG") sequence (in which the spins are first tipped using a tipping pulse followed by a series of refocusing pulses), the Optimized Refocusing Pulse Sequence ("ORPS") in which the refocusing pulses are less than 180°, a saturation recovery pulse sequence, and other pulse sequences.

The acquired spin-echo signals (or other NMR data) may be processed (e.g., inverted, transformed, etc.) to a relaxation-time distribution (e.g., a distribution of transverse relaxation times $T_2$ or a distribution of longitudinal relaxation times $T_1$), or both. The relaxation-time distribution can be used to determine various physical properties of the formation by solving one or more inverse problems. In some cases, relaxation-time distributions are acquired for multiple logging points and used to train a model of the subterranean region. In some cases, relaxation-time distributions are acquired for multiple logging points and used to predict properties of the subterranean region.

FIG. 2A is a diagram of an example NMR tool 200A. The example NMR tool 200A includes a magnet assembly that generates a static magnetic field to produce polarization, and an antenna assembly that (a) generates a RF magnetic field to generate excitation, and (b) acquires NMR signals. In the example shown in FIG. 2A, the magnet assembly that includes the end piece magnets 11A, 11B and a central magnet 12 generates the static magnetic field in the volume of investigation 17. In the volume of investigation 17, the direction of the static magnetic field (shown as the solid black bolded arrow 18) is parallel to the longitudinal axis of the wellbore. In some examples, a magnet configuration with double pole strength can be used to increase the strength of the magnetic field (e.g., up to 100-150 Gauss or higher in some instances).

In the example shown in FIG. 2A, the antenna assembly 13 includes two mutually orthogonal transversal-dipole antennas 15, 16. In some instances, the NMR tool 200A can be implemented with a single transversal-dipole antenna. For example, one of the transversal-dipole antennas 15, 16 may be omitted from the antenna assembly 13. The example transversal-dipole antennas 15, 16 shown in FIG. 2A are placed on an outer surface of a soft magnetic core 14, which is used for RF magnetic flux concentration. The static magnetic field can be axially symmetric (or substantially axially symmetric), and therefore may not require broader band excitation associated with additional energy loss. The volume of investigation can be made axially long enough and thick enough (e.g., 20 cm long, and 0.5 cm thick in some environments) to provide immunity or otherwise decrease sensitivity to axial motion, lateral motion, or both. A longer sensitivity region can enable measurement while tripping the drill string. The sensitivity region can be shaped by shaping the magnets 11A, 11B, 12 and the soft magnetic material of the core 14.

In some implementations, the antenna assembly 13 additionally or alternatively includes an integrated coil set that performs the operations of the two transversal-dipole antennas 15, 16. For example, the integrated coil may be used (e.g., instead of the two transversal-dipole antennas 15, 16) to produce circular polarization and perform quadrature coil detection. Examples of integrated coil sets that can be adapted to perform such operations include multi-coil or complex single-coil arrangements, such as, for example, birdcage coils commonly used for high-field magnetic resonance imaging ("MRI").

Compared to some example axially-symmetrical designs, the use of the longitudinal-dipole magnet and the transversal-dipole antenna assembly also has an advantage of less eddy current losses in the formation and drilling fluid (i.e., "mud") in the wellbore due to a longer eddy current path than for some longitudinal-dipole antenna(s).

In some aspects, NMR measurements over multiple sub-volumes can increase the data density and therefore SNR per unit time. Multiple volume measurements in a static magnetic field having a radial gradient can be achieved, for example, by acquiring NMR data on a second frequency while waiting for nuclear magnetization to recover (e.g., after a CPMG pulse train) on a first frequency. A number of different frequencies can be used to run a multi-frequency NMR acquisition involving a number of excitation volumes with a different depth of investigation. In addition to higher SNR, the multi-frequency measurements can also enable profiling the fluid invasion in the wellbore, enabling a better assessment of permeability of earth formations. Another way to conduct multi-volume measurements is to use different regions of the magnet assembly to acquire an NMR signal. NMR measurements of these different regions can be run at the same time (e.g., simultaneously) or at different times.

FIG. 2B is a diagram of another example NMR tool 200B. The example NMR tool 200B also includes a magnet assembly that generates a static magnetic field to produce polarization, and an antenna assembly that (a) generates an RF magnetic field to generate excitation, and (b) acquires NMR signals. In the example shown in FIG. 2B, the magnet assembly produces a magnetic field having a dominant axial component in the volume of investigation 21. The directions of the RF magnetic field (produced by two transversal dipole antennas as in FIG. 2A) and the static magnetic field in this region are shown at 22. In the example shown in FIG. 2B, two distinct volumes of investigation 24A, 24B are created near the magnet poles (beyond the axial ends of the central magnet) where the static magnetic field has a predominantly radial component. The example NMR antennas shown at 23A and 23B can generate RF magnetic fields in the volumes of investigation 24A and 24B near the longitudinal-dipole antennas. The longitudinal direction of the RF magnetic fields in the volumes of investigation 24A and 24B, and the radial direction of the static magnetic field in the volumes of investigation 24A and 24B, are shown at 25A and 25B.

In some aspects, a combination of transversal-dipole and monopole antennas can be used to enable unidirectional azimuthally-selective measurements, without substantially reducing SNR in some cases. In some examples, the NMR excitation can be substantially axially symmetric (e.g., using either the transversal-dipole antenna or the monopole antenna) while a combination of axially-symmetrical sensitivity transversal-dipole antenna and the axially-symmetrical sensitivity monopole antenna responses can enable azimuthally-resolved measurements.

Figure 3A:
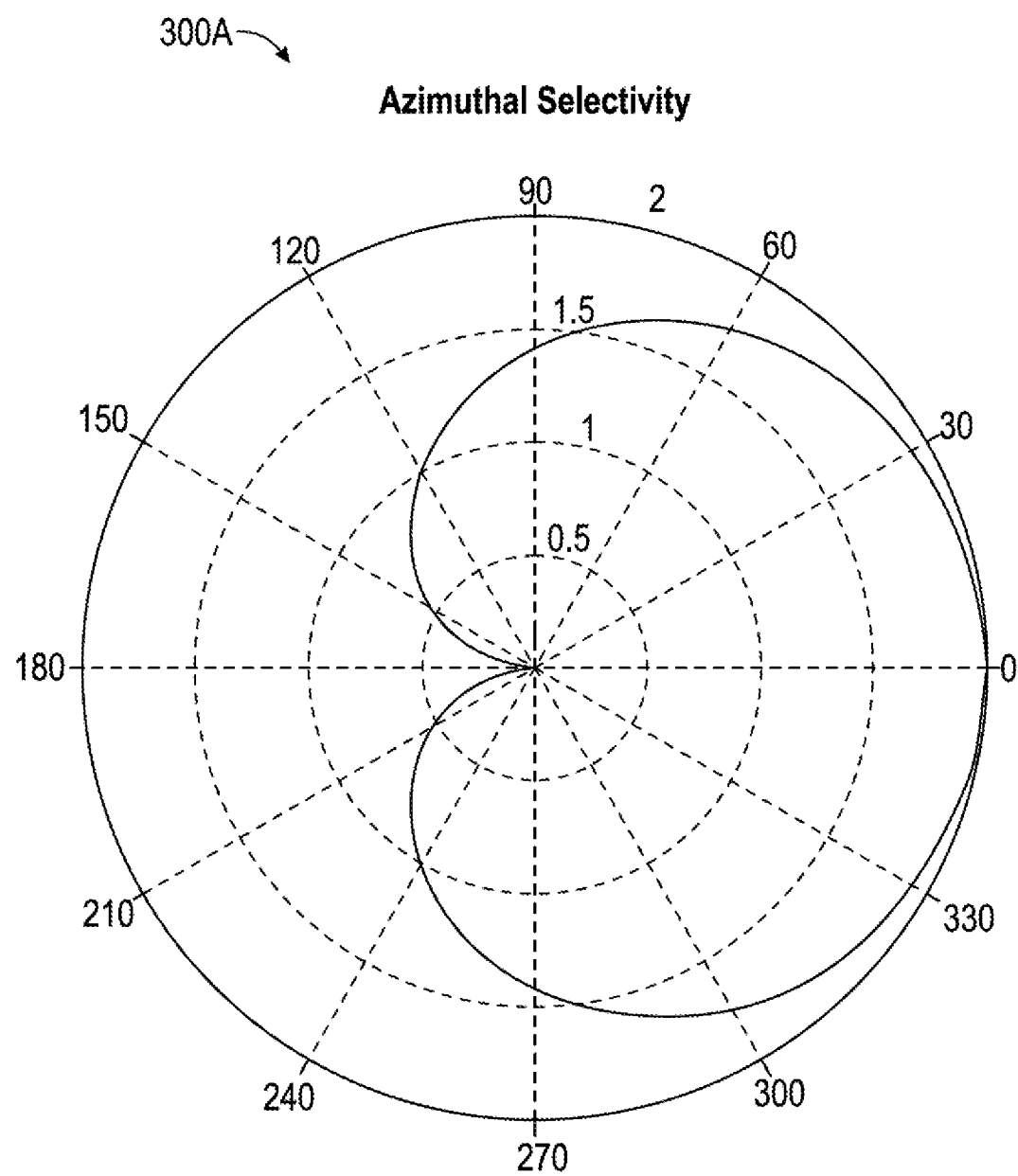
FIG. 3A is a plot showing azimuthal selectivity for an example downhole tool.
Figure 3B:
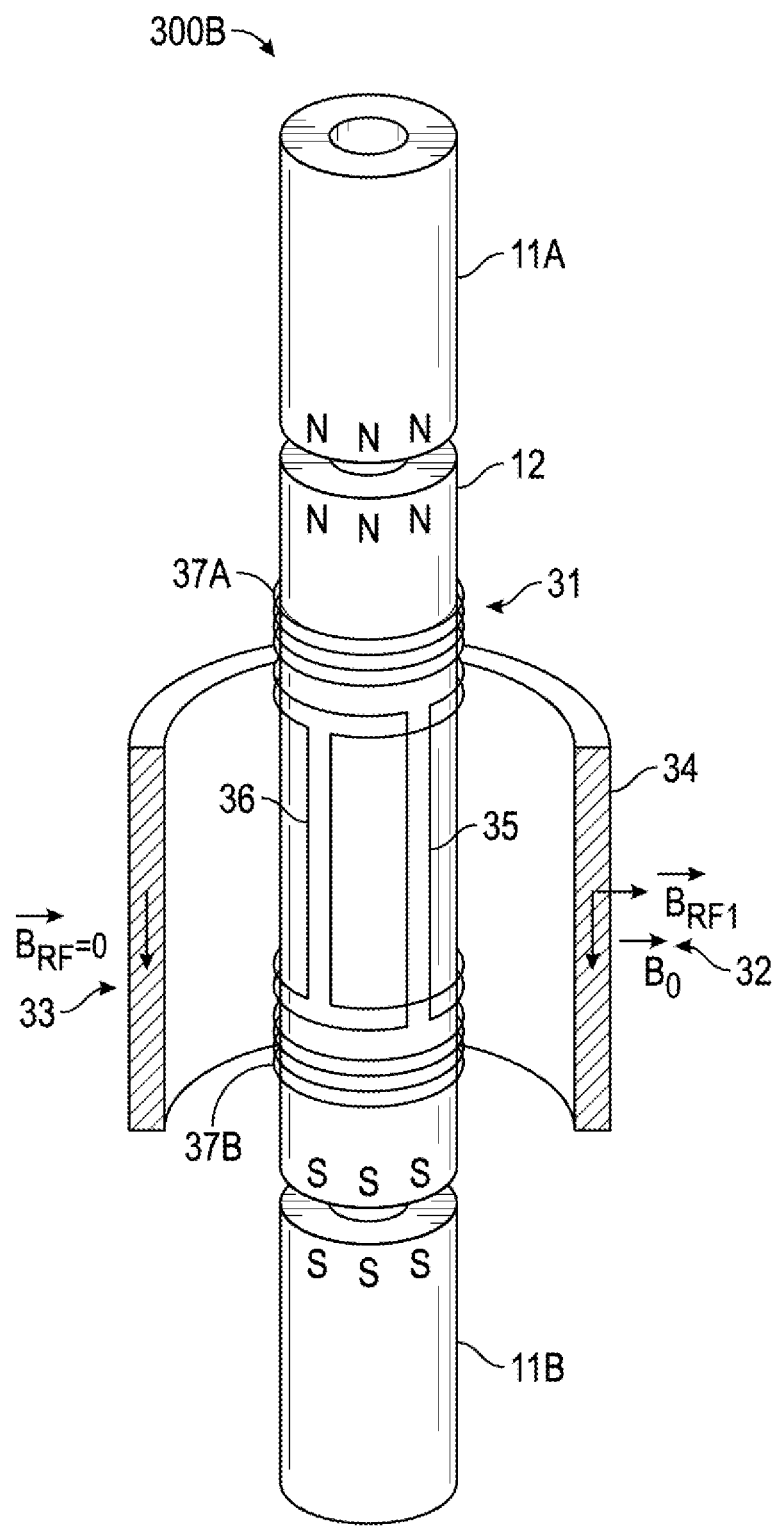
FIG. 3B is a diagram of another example downhole tool for obtaining NMR data from a subterranean region.

FIGS. 3A and 3B illustrate aspects of an example azimuthally-selective NMR tool. FIG. 3A is a plot 300A showing an example of azimuthally selected data from the example downhole tool 300B shown in FIG. 3B. The example NMR tool 300B includes a magnet assembly that generates a static magnetic field to produce polarization, and an antenna assembly that (a) generates an RF magnetic field to generate excitation, and (b) acquires NMR signals. The antenna assembly 31 shown in FIG. 3B includes a monopole antenna and two orthogonal transversal-dipole antennas 35 and 36. The example monopole antenna includes two coils 37A and 37B connected in reverse polarity in order to generate a substantially radial RF magnetic field in the volume of investigation 34. Due to reciprocity, the same coil arrangement can have a radial sensitivity direction. The example RF magnetic fields BRF presented at 32 and 33 can reflect the total sensitivity direction when the monopole antenna response is combined with one of the transversal-dipole antenna responses.

The example monopole antenna shown in FIG. 3B includes an arrangement of coils that generate locally a substantially radially-directed magnetic field, i.e., the field that would be produced by a single "magnetic charge" or magnetic pole. Here, we use the term "monopole" to distinguish this type of magnetic field from a dipole magnetic field (transversal or longitudinal).

In some cases, the monopole antenna assembly generates quasi-stationary (relatively low frequency) magnetic fields. In the example shown, the coils 37A and 37B, which are connected in reverse polarity, are two parts of one monopole antenna assembly. Each coil by itself can be implemented as a standard longitudinal antenna. A monopole antenna can be implemented in another manner.

The polar plot in FIG. 3A shows an example of the antenna sensitivity, demonstrating unidirectional azimuthal selectivity. A combination of the responses of each of the orthogonal transversal-dipole antennas with the response of the monopole antenna can give any of four possible directions covering all quadrants of the transversal plane. Rotation of the drill string while drilling may cause an amplitude modulation of the azimuthally selective response and therefore an amplitude modulation of the NMR relaxation signal (e.g., a CPMG echo train). The amplitude modulation parameters can indicate the azimuthal variations of the NMR properties (e.g., the NMR porosity variations).

The coils 37A and 37B of the example monopole antenna shown in FIG. 3B can be used in combination with transversal-dipole antennas 35 and 36, for example, to achieve azimuthal selectivity. Either of the coils 37A and 37B can also be used as a separate antenna (in addition to or without the transversal-dipole antennas 35, 36), for example, to gain SNR. In some cases, an NMR tool is implemented with a monopole antenna and a longitudinal magnet, without other antennas. For example, the transversal-dipole antennas 35 and 36 may be omitted from the antenna assembly 31 in some cases.

Figure 4A:
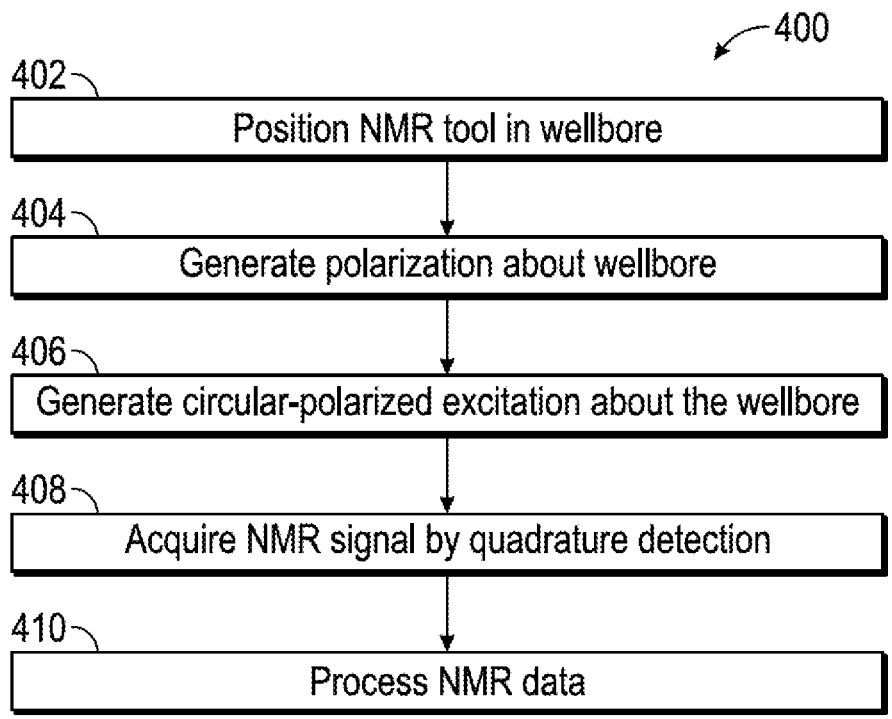
FIG. 4A is a flowchart showing an example technique for obtaining NMR data from a subterranean region.
Figure 4B:
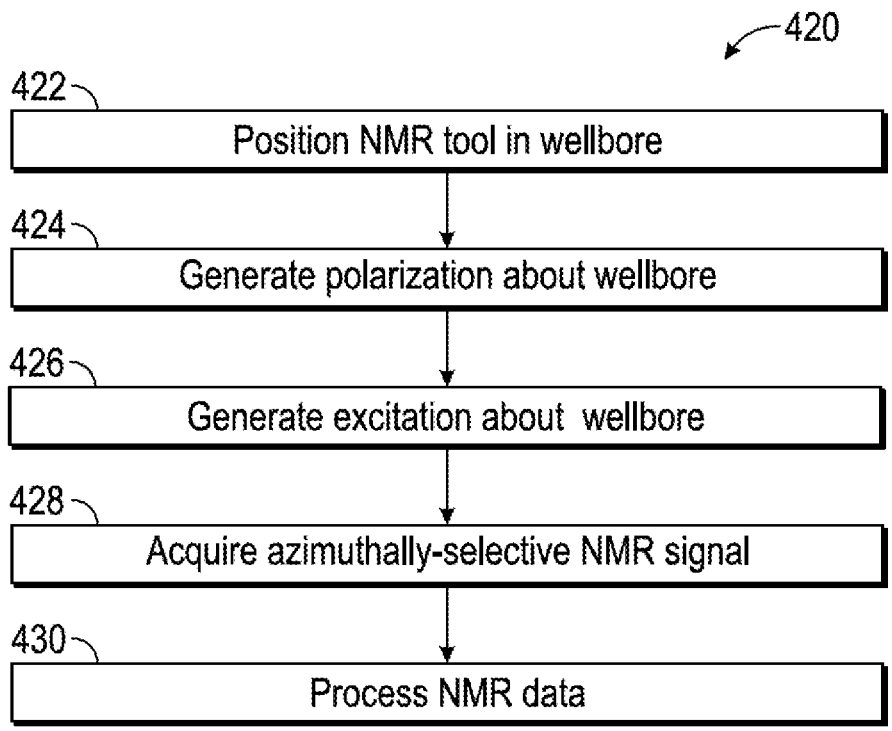
FIG. 4B is a flowchart showing another example technique for obtaining NMR data from a subterranean region.

FIG. 4A is a flowchart showing an example process 400 for obtaining NMR data from a subterranean region; and FIG. 4B is a flowchart showing another example process 420 for obtaining NMR data from a subterranean region. Each of the processes 400 and 420 can be performed independent of the other, or the processes 400 and 420 can be performed concurrently or in concert. For example, the processes 400 and 420 may be performed in series or in parallel, or one of the processes may be performed without performing the other.

The processes 400 and 420 can be performed by downhole NMR tools such as the example NMR tools 200A, 200B, or 300B shown in FIGS. 2A, 2B and 3B, or by another type of NMR tool described herein. The processes 400 and 420 can be performed by a downhole NMR tool while the tool is disposed within a wellbore during well system operations. For example, the downhole NMR tool can be suspended in the wellbore for wireline logging (e.g., as shown in FIG. 1B), or the downhole NMR tool can be coupled to a drill string for NMR LWD (e.g., as shown in FIG. 1C).

Each of the processes 400 and 420 can include the operations shown in FIGS. 4A and 4B (respectively), or either of the processes can include additional or different operations. The operations can be performed in the order shown in the respective figures or in another order. In some cases, one or more of the operations can be performed in series or parallel, during overlapping or non-overlapping time periods. In some cases, one or more of the operations can be iterated or repeated, for example, for a specified number of iterations, for a specified time duration, or until a terminating condition is reached.

At 402 in the example process 400 shown in FIG. 4A, the NMR tool is positioned in a wellbore. In some cases, the NMR tool includes a magnet assembly to produce a magnetic field in a volume in the subterranean region about the wellbore. The volume can include, for example, all or part of any of the volumes of investigation 17, 21, 24A, 24B, 34 shown in FIG. 2A, 2B or 3B, or another volume of interest. Generally, the NMR tool includes a magnet assembly to polarize nuclear spins in the volume of interest, and an antenna assembly to excite the nuclear spins and to acquire an NMR signal based on the excitation.

At 404, polarization is generated in a volume about the wellbore. The polarization is generated by a static magnetic field, which is produced by the magnet assembly of the NMR tool in the wellbore. The polarization refers to the magnetic polarization of the nuclear spins in the volume. In other words, a portion of the nuclear spins becomes aligned with the static magnetic field, and the volume develops a bulk magnetic moment. In some cases, the static magnetic field is configured (e.g., by the shape and position of the magnet assembly) to produce longitudinal polarization (e.g., parallel to the long axis of the wellbore) or polarization having another orientation.

In some examples, the magnet assembly includes a central magnet (e.g., the central magnet 12 shown in FIG. 2A, 2B, 3B, or another type of central magnet) and two end piece magnets (e.g., the end piece magnets 11A, 11B shown in FIG. 2A, 2B, 3B, or another type of end piece magnet). In some cases, the magnets in the magnet assembly are permanent magnets. As shown, for example, in FIG. 2A, the central magnet can be an elongate permanent magnet having a first axial end and a second, opposite axial end, with the first end piece magnet spaced apart from the first axial end of the central magnet, and with the second end piece magnet spaced apart from the second axial end of the central magnet. In some cases, the two end piece magnets have a common magnetic field orientation, and the central magnet has the opposite magnetic field orientation (e.g., such that both end piece magnets have a magnetic field orientation that is orthogonal to the magnetic field orientation of the central magnet).

At 406, circular-polarized excitation is generated in the volume about the wellbore. The circular-polarized excitation is produced in the volume by an antenna assembly. For example, the antenna assembly can be energized by a radio-frequency current, which produces an RF magnetic field in the volume about the wellbore. The RF magnetic field generated by the antenna assembly manipulates the nuclear spins to produce an excited spin state that has circular polarization. In other words, the resulting spin polarization has a circular (or circumferential) orientation in the volume about the wellbore.

In some examples, the antenna assembly includes orthogonal transversal-dipole antennas. The antenna assembly 13 shown in FIGS. 2A and 2B and the antenna assembly 31 shown in FIG. 3B are examples of antenna assemblies that include two orthogonal transversal-dipole antennas. Each antenna 15, 16 in the example antenna assembly 13 can independently produce a transversal-dipole magnetic field, for example, by conducting radio-frequency current. In the examples shown, each transversal-dipole magnetic field has a transverse orientation with respect to the longitudinal axis of the NMR tool. In other words, the transversal-dipole magnetic field is oriented orthogonal to the long axis of the wellbore.

In the example shown, the transversal-dipole magnetic field produced by the antenna 15 is orthogonal to the transversal-dipole magnetic field produced by the other antenna 16. For example, in a Cartesian coordinate system of three mutually-orthogonal directions, the longitudinal axis of the NMR tool can be considered the "z" direction, and the transversal-dipole magnetic fields (produced by the antennas 15, 16) are oriented along the "x" and "y" directions, respectively.

In some implementations, other types of excitation are produced by the NMR tool. For example, in some cases, the circular-polarized excitation is produced in a first sub-volume (e.g., the volume of investigation 21 in FIG. 2B) by the orthogonal transversal-dipole antennas, and excitation having another orientation is produced in second and third sub-volumes (e.g., the volumes of investigation 24A, 24B in FIG. 2B) that are spaced apart from the axial ends of the first sub-volume. The excitation in the second and third sub-volumes can be produced, for example, by a longitudinal-dipole RF field generated by other antenna assemblies (e.g., by antennas 23A and 23B in FIG. 2B). The distinct sub-volumes may be useful for different purposes. For example, the first sub-volume can be elongate (parallel to the long axis of the wellbore), to acquire NMR data from the first sub-volume while the NMR tool moves along the wellbore (e.g., while tripping a drill string). In some cases, the other sub-volumes can be positioned to acquire NMR data for mud filtrate invasion profiling or other applications.

At 408, an NMR signal is acquired by quadrature coil detection. The NMR signal is based on the excitation generated at 406. The NMR signal can be, for example, an echo train, a free induction decay ("FID"), or another type of NMR signal. In some cases, the acquired NMR data includes $T_1$ relaxation data, $T_2$ relaxation data, or other data. The NMR signal can be acquired by the antenna assembly that produced the excitation or by another antenna assembly. In some cases, an NMR signal can be acquired in multiple sub-volumes.

Quadrature coil detection can be performed by the orthogonal transversal-dipole antennas. Quadrature coil detection can be performed by using two orthogonal coils, each picking up the signal induced by circular polarized nuclear magnetization (the signal in the coils have 90 degree phase difference). Even if during transmission only one coil is used (e.g., producing linear polarized RF magnetic field), the nuclear magnetization can still be circular polarized. Quadrature coil transmission (two orthogonal coils driven by RF currents having 90 degree phase difference) can enable circular polarized excitation, which can help to reduce power consumption compared to a linear polarized excitation in some cases. Quadrature coil detection can be used, for example, to increase SNR when exciting only one coil (not using circular polarized excitation to simplify hardware), or circular polarization can be used to save power while detecting signals with one coil. In some cases, both circular polarization and quadrature coil detection can be used to save power and increase SNR. In some cases, the use of circular polarization or quadrature coil detection (or both) is efficient when the mutually orthogonal antennas are substantially identical. This is possible in the example magnet/antenna configuration that has a longitudinal dipole magnet and two transversal antennae. Other configurations that have one of the two antennae less efficient than the other, although allowing for mutually orthogonal antennae, may not provide the same advantages in some cases.

At 410, the NMR data are processed. The NMR data can be processed to identify physical properties of the subterranean region or to extract other types of information. For example, the NMR data may be processed to identify density, viscosity, porosity, material content, or other properties of the subterranean region about the wellbore.

At 422 in the example process 420 shown in FIG. 4B, the NMR tool is positioned in a wellbore, and at 424 polarization is generated in a volume about the wellbore. Operations 422 and 424 in FIG. 4B are similar to operations 402 and 404 shown in FIG. 4A. For example, the NMR tool includes a magnet assembly to polarize nuclear spins in the volume of interest, and an antenna assembly to excite the nuclear spins and to acquire an NMR signal based on the excitation. The polarization can be produced at 424 in the manner described with respect to operation 404 of FIG. 4A and by the same type of magnet assembly; or polarization can be produced at 424 in another manner or by another type of magnet assembly.

At 426, excitation is generated in a volume about the wellbore. The excitation is produced in the volume by an antenna assembly. For example, the antenna assembly can be energized by a radio-frequency current, which produces a radio-frequency (RF) magnetic field in the volume about the wellbore. The RF magnetic field generated by the antenna assembly manipulates the nuclear spins to produce an excited spin state. In some instances, the spin state has a higher excitation in a selected azimuthal direction, such that the level of spin excitation varies along a circular (or circumferential) direction about the wellbore, for example, due to an azimuthally-selective RF magnetic field.

In some examples, the antenna assembly includes a transversal-dipole and monopole antenna assembly. The antenna assembly 31 shown in FIG. 3B is an example of an antenna assembly that includes a transversal-dipole and monopole antenna assembly. In the example shown in FIG. 3B, the transversal-dipole and monopole antenna assembly includes two orthogonal transversal-dipole antennas 35 and 36 in a central region, and a monopole antenna that includes a first coil 37A at a first axial end of the transversal-dipole antennas 35 and 36 and a second coil 37B at a second, opposite axial end of the transversal-dipole antennas 35 and 36; the coils 37A and 37B of the monopole antenna are arranged with opposite polarity.

At 428, an azimuthally-selective NMR signal is acquired. The NMR signal is based on the excitation generated at 426. The NMR signal can be, for example, an echo train, a free induction decay ("FID"), or another type of NMR signal. In some cases, the acquired NMR data includes $T_1$ relaxation data, $T_2$ relaxation data, or other data. The NMR signal can be acquired by the antenna assembly that produced the excitation or by another antenna assembly. In some cases, the NMR signal is acquired by an antenna assembly having azimuthally-selective sensitivity, such as, a transversal-dipole and monopole antenna assembly.

In some implementations, the azimuthally-selective NMR signal is acquired as a combination of multiple NMR signal acquisitions. The signal acquisitions can include, for example, acquisitions by one or more transversal-dipole antennas and one or more monopole antennas. The signals can be combined to enable azimuthally-resolved measurements of the volume about the wellbore. For example, in some cases, a proper combination of the responses of each of the orthogonal transversal-dipole antennas with the response of the monopole antenna can give any of four possible directions covering all quadrants of the transversal plane. At 430, the NMR data are processed. The NMR data can be processed to identify physical properties of the subterranean region or to extract other types of information. For example, the NMR data may be processed to identify density, viscosity, porosity, material content, or other properties of the subterranean region about the wellbore. In some cases, the NMR data are processed to identify azimuthal variations in the subterranean region about the wellbore. For example, rotating the NMR tool may cause an amplitude modulation of the azimuthally-selective response. The amplitude modulation parameters can indicate the azimuthal variations of the properties affecting the NMR signal (e.g., porosity, density, viscosity, material content, etc.).

Figure 5A:
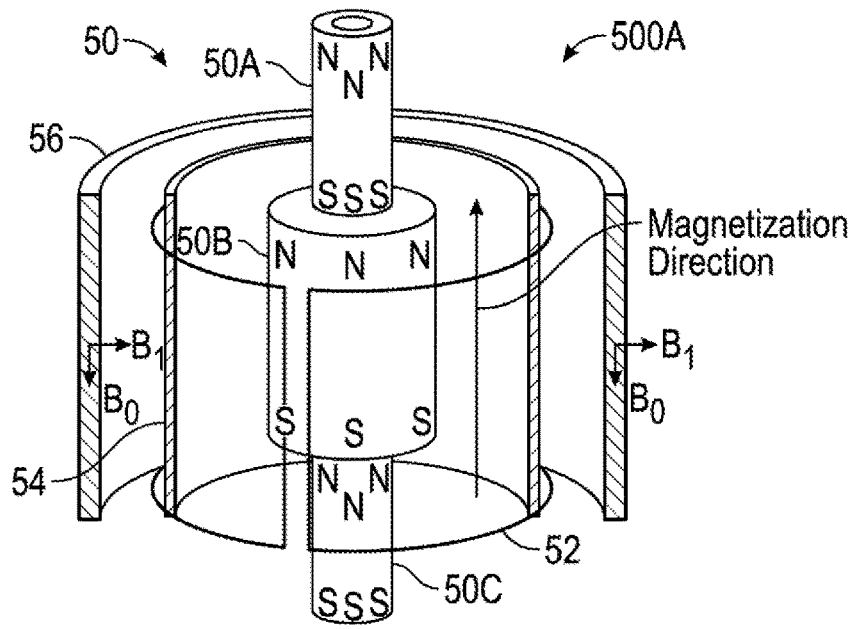
FIGS. 5A and 5B are exploded sectional views of NMR tools, according to alternative embodiments of the present disclosure.

FIG. 5A is an exploded sectional view of an NMR tool, according to an alternative embodiment of the present disclosure. NMR tool 500A includes a magnet assembly 50 that produces static magnetic field 56 in a longitudinal direction (as indicated by arrow $B_0$) in volume 56 of a subterranean region. In this example, magnet assembly 50 has a magnetization direction in one longitudinal direction throughout magnet assembly 50 (the uphole direction as indicated by the arrow in FIG. 5A). Magnet assembly 50 may be comprised of one magnet or multiple magnets placed together. In the illustration, three end piece magnet 50A, central piece magnet 50B, and end piece magnet 50C have been coupled end-to-end to one another to form magnet assembly 50. As can be seen, the polarizations of magnets 50A, 50B, and 50C are coupled such that the magnetization direction across the entire magnet assembly 50 is in a single direction.

Also, in this example, central magnet piece 50B has a larger cross-sectional area than end piece magnets 50A and 50C. This feature allows the magnetic field in the volume of interest to be more uniform and maximizes the efficiency of the antenna to detect such volume of interest. Alternatively, central piece magnet 50B may have a higher remnant flux density in comparison to first and second end piece magnets 50A and 50C, which provides the same function as the larger cross-section. In yet other alternative embodiments, magnet assembly 50 may include a combination of larger cross-sections and higher remnant flux densities.

Although not shown, a tubular body (e.g., drill collar) is positioned around magnet assembly 50. In this example, a magnetic sleeve 54 comprised of soft magnetic core material is placed around the tubular body and magnet assembly 50. Alternatively, the soft magnetic core material may form the tubular body. The soft magnetic core material may be comprised of, for example, iron-silicon alloy, amorphous or nano-crystalline alloy, nickel-iron alloy, soft ferrite, or cobalt, or any other material having an intrinsic coercivity of less than 1000 A/m. Other examples include those Fluxtrol® or Micrometals™ soft magnetic materials. As such, magnet assembly 50 may be conductive or non-conductive. An example of a conductive magnet assembly may be one made of an amorphous or nano-crystalline alloy. An antenna assembly 52 is positioned around magnetic sleeve 54. Antenna assembly 52 may be any of the antennas described herein. As such, during excitation of volume 56, magnetic sleeve 54 protects magnet assembly 50 and other internal components (e.g., conductive components) from the RF signals in order to avoid the heat loss (more noise), reduced antenna efficiency (more power needed and lower signal levels), and ringing (longer TE) effects caused when conductive components are not protected.

Moreover, note in alternate embodiments, a protective sleeve (not shown) may be placed around magnetic sleeve 54 in order to protect the soft magnetic material from the harsh downhole environment. When used, the protection sleeve may be comprised of a hard RF transparent material such as, for example, fiberglass or PEEK.

Figure 5B:
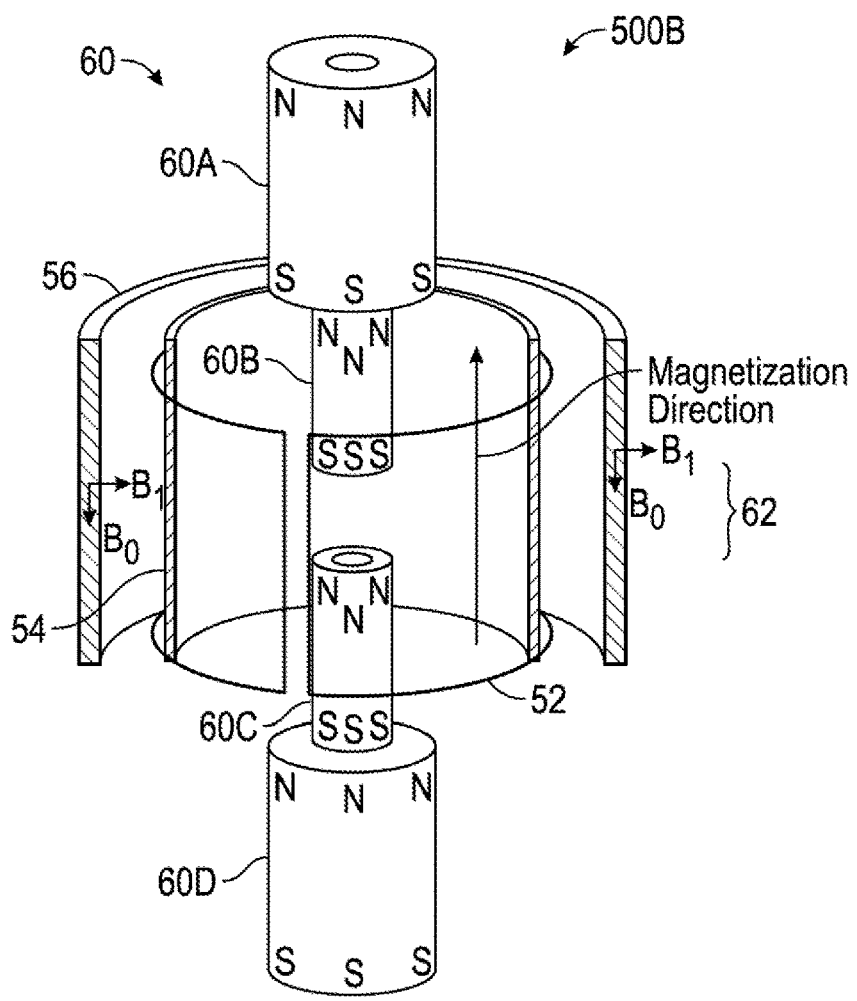

FIG. 5B is an exploded sectional view of an NMR tool, according to an alternative embodiment of the present disclosure. NMR tool 500B is similar to tool 500A and like elements refer to like elements. However, magnet assembly 60 is different from magnet assembly 50. Here, NMR tool 500B includes a magnet assembly 60 that produces static magnetic field 56 in a longitudinal direction (as indicated by arrow $B_0$) in volume 56 of a subterranean region. In this example, magnet assembly 60 has a magnetization direction in one longitudinal direction throughout magnet assembly 60 (the uphole direction as indicated by the arrow in FIG. 5B). Magnet assembly 60 may be comprised of one magnet or multiple magnets placed together. In the example, however, magnet assembly 60 includes a first magnet section that includes magnet piece 60A and opposing piece 60B, and a second magnet section that includes magnet piece 60C and opposing end piece 60D.

Magnet pieces 60B and 60C are separated longitudinally from one another such that a gap 62 is present between them. The distance of gap 62 may be, for example, 5 inches. Gap 62 optimizes the magnetic field distribution generated by magnet assembly 60 such that at a desired depth of investigation, the static magnetic field is uniform in front of the antenna window. As can be seen, the polarizations of magnets pieces 60A-60D are coupled such that the magnetization direction across the entire magnet assembly 60 is in a single direction throughout assembly 60.

In this example, end pieces 60B and 60C are positioned adjacent gap 62 and have a smaller cross-sectional area in comparison to their respective opposing end pieces 60A and 60D. Alternatively, end pieces 60B and 60C may have a smaller remnant flux density in comparison to their respective opposing end pieces 60A and 60D. In yet other alternative embodiments, magnet assembly 60 may include a combination of smaller cross-sections and smaller remnant flux densities. The effect of this configuration is, again, a uniform magnetic field.

Figure 6A:
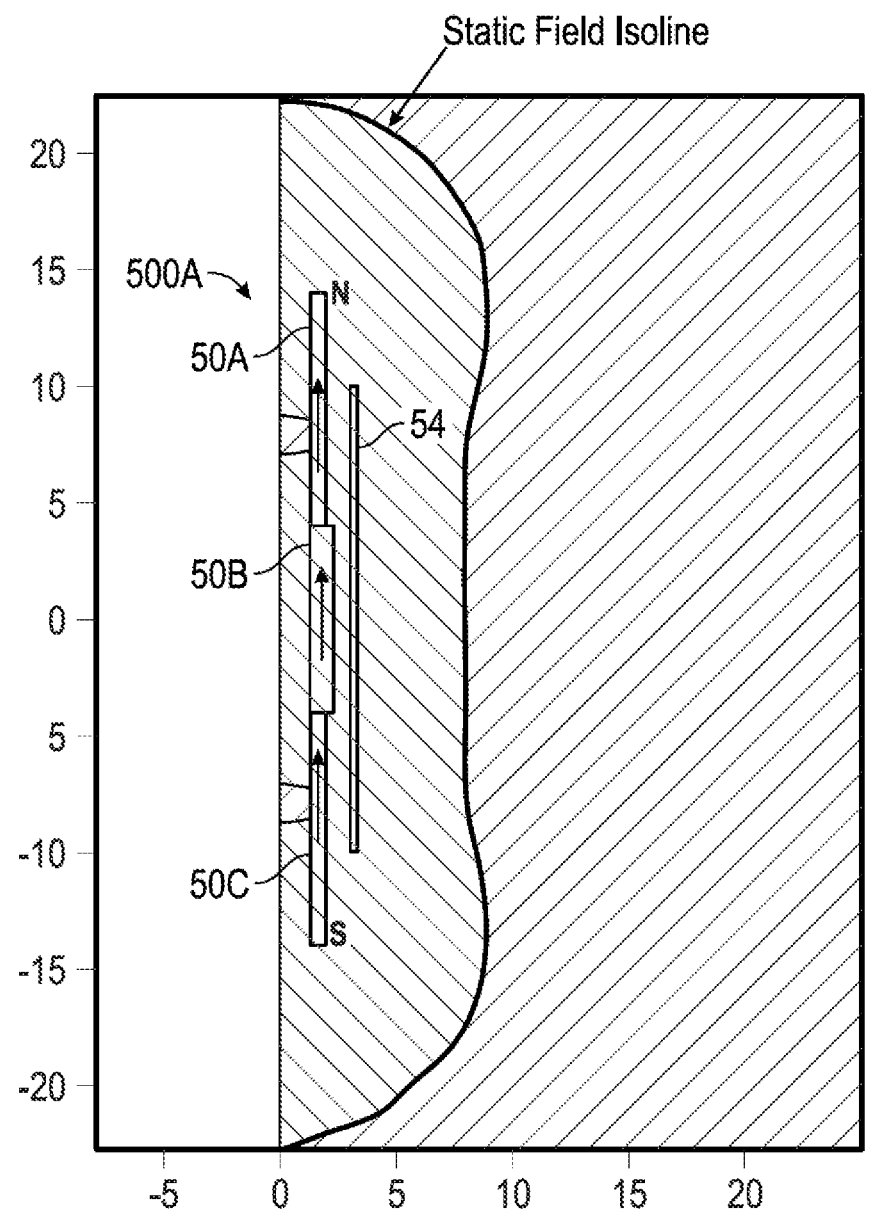
FIGS. 6A and 6B show a finite element modeling results of NMR tools 500A and 500B, respectively.
Figure 6B:
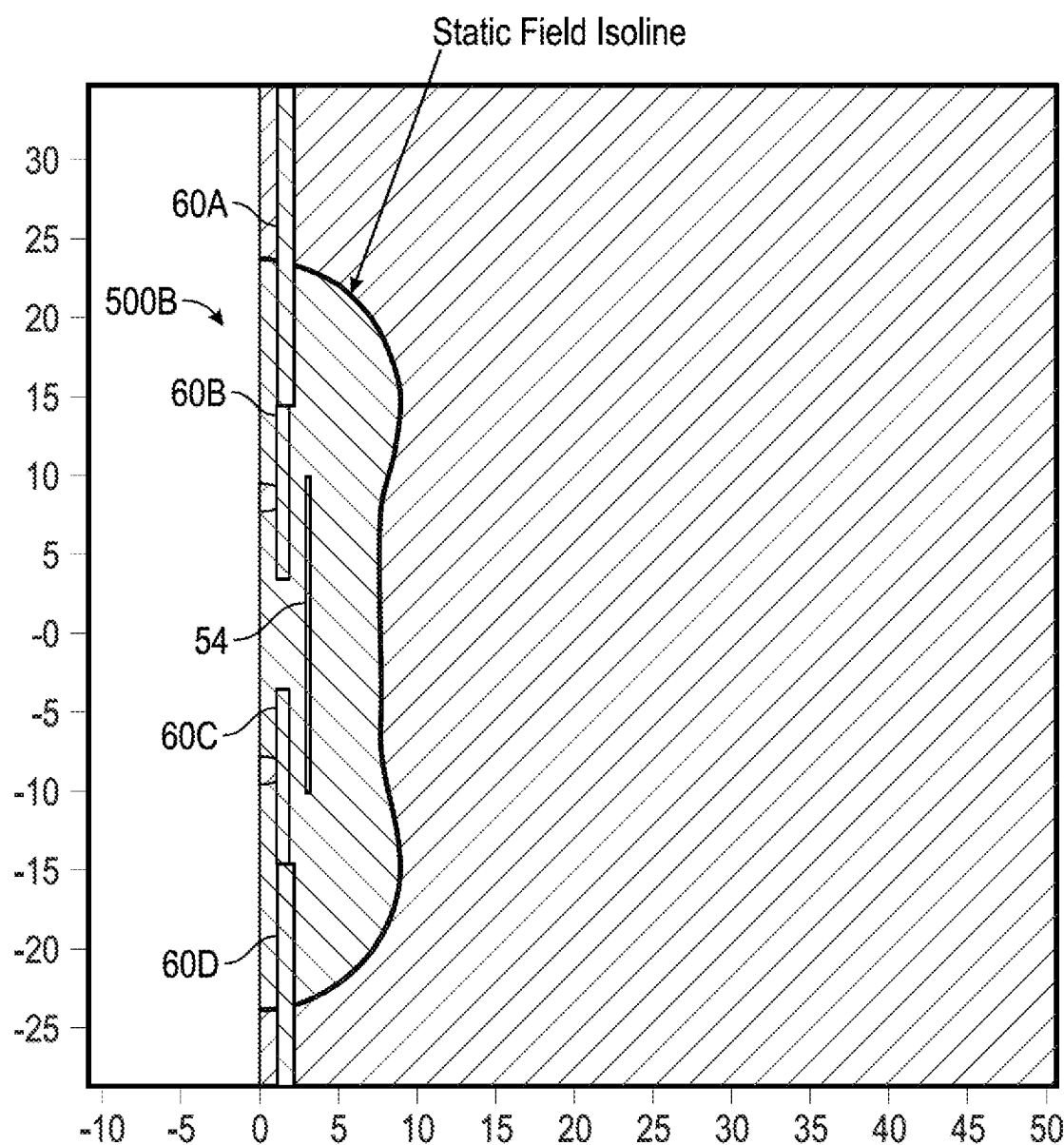

FIG. 6A shows a finite element modeling result of an NMR tool 500A. The x-axis represents the transversal direction, while the y-axis represents the longitudinal direction. Only half of the cross section is shown because the configuration is axially symmetric. The static field isoline corresponds to a 1H (proton) resonance frequency of about 310 kHz. The area that is most sensitive to RF field radiation is the straight middle section which is about 14"-16" long. The coils can be 12"-14" long and is placed immediately outside the soft magnetic core material. One advantage of the present disclosure over conventional approaches is that the magnetic section is significantly shorter, which allows for a shorter tool that is easy to maneuver downhole. FIG. 6B shows a finite element modeling result of an NMR tool 500B. The x-axis represents the transversal direction, while the y-axis represents the longitudinal direction. Only half of the cross section is shown because the configuration is axially symmetric. The static field isoline corresponds to a 1H (proton) resonance frequency of about 310 kHz. The area that is most sensitive to RF field radiation is the straight middle section which is about 18" long. The coils can be 12"-14" long and is placed immediately outside the soft magnetic core material. Again, this magnetic section is significantly shorter, which allows for a shorter tool that is easy to maneuver downhole.

Figure 7:
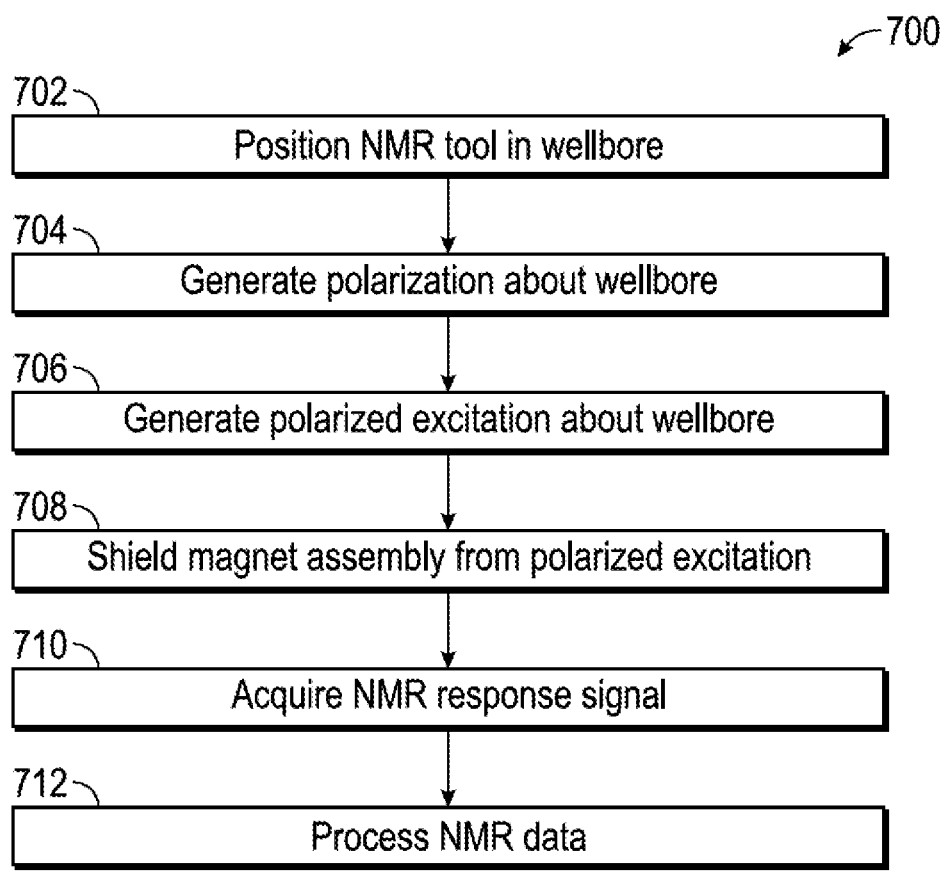
FIG. 7 is a flowchart showing an example process for obtaining NMR data from a subterranean region using NMR tools 500A or 500B.

FIG. 7 is a flowchart showing an example process 700 for obtaining NMR data from a subterranean region. At 702, an illustrative NMR tool (e.g., NMR tool 500A or 500B) is positioned in a wellbore. At 704, the magnet assembly generates a polarization about the wellbore. Here, the magnet assembly may produce a magnetic field in a longitudinal direction in a volume of the subterranean region. The magnet assembly includes a magnetization direction in one longitudinal direction throughout the magnet assembly. At 706, polarized excitation is generated about the wellbore by an antenna assembly positioned around the magnet assembly. In certain embodiments described herein, the polarized excitation may be circular-polarized excitation. Nevertheless, at 708, the magnet assembly is shielded from the polarized excitation using a magnetic sleeve positioned between the magnet assembly and the antenna assembly. At 710, an NMR response signal is acquired from the volume by the antenna assembly and, at 712, the NMR data is processed.

Moreover, any of the methods described herein may be acquired and processed by on-board or remote processing circuitry that includes at least one processor and a non-transitory and computer-readable storage, all interconnected via a system bus. Software instructions executable by the processing circuitry for implementing the illustrative methods described herein in may be stored in local storage or some other non-transitory computer-readable medium. It will also be recognized that the positioning software instructions may also be loaded into the storage from a CD-ROM or other appropriate storage media via wired or wireless methods.

Moreover, various aspects of the disclosure may be practiced with a variety of computer-system configurations, including hand-held devices, multiprocessor systems, microprocessor-based or programmable-consumer electronics, minicomputers, mainframe computers, and the like. Any number of computer-systems and computer networks are acceptable for use with the present disclosure. The disclosure may be practiced in distributed-computing environments where tasks are performed by remote-processing devices that are linked through a communications network. In a distributed-computing environment, program modules may be located in both local and remote computer-storage media including memory storage devices. The present disclosure may therefore, be implemented in connection with various hardware, software or a combination thereof in a computer system or other processing system.

Embodiments and methods described herein further relate to any one or more of the following paragraphs:

1. A nuclear magnetic resonance ("NMR") tool for use in a wellbore positioned in a subterranean region, the NMR tool comprising a magnet assembly to produce a magnetic field in a longitudinal direction in a volume of the subterranean region, wherein the magnet assembly has a magnetization direction in one longitudinal direction throughout the magnet assembly; a magnetic sleeve positioned around the magnet assembly; and an antenna assembly positioned around the magnetic sleeve.

2. The NMR tool of paragraph 1, wherein the magnetic sleeve comprises a soft magnetic material.

3. The NMR tool of paragraphs 1 or 2, wherein the magnet assembly comprises a first end piece and a second, opposite end piece; and a central piece positioned between the first and second end pieces, wherein the central piece has a larger cross-sectional area or a higher remnant flux density in comparison to the first and second end pieces.

4. The NMR tool of any of paragraphs 1-3, wherein the magnet assembly comprises a first magnet section and a second magnet section longitudinally separated from one another such that a gap is present there between; and the first and second magnet sections each comprise a first end piece and a second, opposite end piece, wherein the first end pieces are positioned adjacent the gap and have a smaller cross-sectional area or smaller remnant flux density in comparison to the second end pieces.

5. The NMR tool of any of paragraphs 1-4, wherein the antenna assembly comprises transversal-dipole or monopole antennas.

6. The NMR tool of any of paragraphs 1-5, wherein the transversal-dipole antenna comprises mutually orthogonal transversal-dipole antennas.

7. The NMR tool of any of paragraphs 1-6, wherein the magnet assembly comprises a conductive magnet.

8. The NMR tool of any of paragraphs 1-7, wherein the NMR tool forms part of a drill string assembly.

9. The NMR tool of any of paragraphs 1-8, wherein the NMR tool forms part of a wireline assembly.

10. A method of obtaining nuclear magnetic resonance ("NMR") data from a subterranean region, the method comprising producing a magnetic field in a longitudinal direction in a volume of the subterranean region by a magnet assembly positioned in a wellbore, the magnet assembly having a magnetization direction in one longitudinal direction throughout the magnet assembly; producing a polarized excitation in the volume using an antenna assembly positioned around the magnet assembly; shielding the magnet assembly from the polarized excitation using a magnetic sleeve positioned between the magnet assembly and the antenna assembly; and acquiring a response from the volume based on the polarized excitation produced by the antenna assembly.

11. The method of paragraph 10, wherein the polarized excitation is circular-polarized excitation produced by a transversal-dipole or monopole antenna assembly.

12. The method of paragraphs 10 or 11, wherein an NMR tool comprises the magnet assembly, magnetic sleeve, and antenna assembly; and the response is acquired while the NMR tool is disposed on a drill string assembly positioned in a wellbore of the subterranean region.

13. The method of any of paragraphs 10-12, wherein an NMR tool comprises the magnet assembly, magnetic sleeve, and antenna assembly; and the response is acquired while the NMR tool is disposed on a wireline assembly positioned in a wellbore of the subterranean region.

14. A downhole assembly comprising a nuclear magnetic resonance ("NMR") tool positioned in a wellbore in a subterranean region, the NMR tool comprising a magnet assembly having unidirectional magnetization which produces a magnetic field in a longitudinal direction in a volume of the subterranean region; a soft magnetic core material positioned around the magnet assembly; and an antenna assembly positioned around the soft magnetic core material.

15. The downhole assembly of paragraph 14, wherein the soft magnetic core material is comprised of at least one of iron, nickel, or cobalt.

16. The downhole assembly of paragraphs 14 or 15, wherein the magnet assembly comprises a first end piece and a second, opposite end piece; and a central piece positioned between the first and second end pieces, wherein the central piece has a larger cross-sectional area or a higher remnant flux density in comparison to the first and second end pieces.

17. The downhole assembly of any of paragraphs 14-16, wherein the magnet assembly comprises a first magnet section and a second magnet section longitudinally separated from one another such that a gap is present there between; and the first and second magnet sections each comprise a first end piece and a second, opposite end piece, wherein the first end pieces are positioned adjacent the gap and have a smaller cross-sectional area or smaller remnant flux density in comparison to the second end pieces.

18. The downhole assembly of any of paragraphs 14-17, wherein the magnet assembly comprises a conductive magnet.

19. The downhole assembly of any of paragraphs 14-18, wherein the assembly a drill string assembly.

20. The downhole assembly of any of paragraphs 14-19, wherein the assembly a wireline assembly.

Moreover, the methods described herein may be embodied within a system comprising processing circuitry to implement any of the methods, or a in a non-transitory computer-readable medium comprising instructions which, when executed by at least one processor, causes the processor to perform any of the methods described herein.

Although various embodiments and methods have been shown and described, the disclosure is not limited to such embodiments and methods and will be understood to include all modifications and variations as would be apparent to one skilled in the art. Therefore, it should be understood that the disclosure is not intended to be limited to the particular forms disclosed. Rather, the intention is to cover all modifications, equivalents and alternatives falling within the spirit and scope of the disclosure as defined by the appended claims.

What is claimed is:

1. A nuclear magnetic resonance ("NMR") tool for use in a wellbore positioned in a subterranean region, the NMR tool comprising:
a magnet assembly to produce a magnetic field in a longitudinal direction throughout a sensitivity volume of the subterranean region, wherein the longitudinal direction is along a longitudinal axis of the NMR tool;
a magnetic sleeve positioned around the magnet assembly; and
an antenna assembly positioned around the magnetic sleeve, wherein:
the magnet assembly comprises a first magnet section and a second magnet section longitudinally separated from one another such that a gap is present there between; and
the first and second magnet sections each comprise a first end piece and a second, opposite end piece, wherein the first end pieces are positioned adjacent the gap and have a smaller cross-sectional area or smaller remnant flux density in comparison to the second end pieces.

2. The NMR tool of claim 1, wherein the magnetic sleeve comprises a soft magnetic material.

3. The NMR tool of claim 1, wherein the antenna assembly comprises transversal-dipole or monopole antennas.

4. The NMR tool of claim 3, wherein the transversal-dipole antenna comprises mutually orthogonal transversal-dipole antennas.

5. The NMR tool of claim 1, wherein the magnet assembly comprises a conductive magnet.

6. The NMR tool of claim 1, wherein the NMR tool forms part of a drill string assembly.

7. The NMR tool of claim 1, wherein the NMR tool forms part of a wireline assembly.

8. A method of obtaining nuclear magnetic resonance ("NMR") data from a subterranean region, the method comprising:
producing a magnetic field in a longitudinal direction throughout a sensitive volume of the subterranean region by a magnet assembly of a tool positioned in a wellbore, wherein the longitudinal direction is along a longitudinal axis of the tool;
producing a polarized excitation in the volume using an antenna assembly positioned around the magnet assembly;
shielding the magnet assembly from the polarized excitation using a magnetic sleeve positioned between the magnet assembly and the antenna assembly; and
acquiring a response from the volume based on the polarized excitation produced by the antenna assembly, wherein:
the magnet assembly comprises a first magnet section and a second magnet section longitudinally separated from one another such that a gap is present there between; and
the first and second magnet sections each comprise a first end piece and a second, opposite end piece, wherein the first end pieces are positioned adjacent the gap and have a smaller cross-sectional area or smaller remnant flux density in comparison to the second end pieces.

9. The method of claim 8, wherein the polarized excitation is circular-polarized excitation produced by a transversal-dipole or monopole antenna assembly.

10. The method of claim 8, wherein:
the tool is an NMR tool comprising the magnet assembly, magnetic sleeve, and antenna assembly; and
the response is acquired while the NMR tool is disposed on a drill string assembly positioned in a wellbore of the subterranean region.

11. The method of claim 8, wherein:
an NMR tool comprises the magnet assembly, magnetic sleeve, and antenna assembly; and
the response is acquired while the NMR tool is disposed on a wireline assembly positioned in a wellbore of the subterranean region.

12. A downhole assembly comprising a nuclear magnetic resonance ("NMR") tool positioned in a wellbore in a subterranean region, the NMR tool comprising:
a magnet assembly having magnetization which produces a unidirectional magnetic field in a longitudinal direction throughout a sensitive volume of the subterranean region, wherein the longitudinal direction is along a longitudinal axis of the NMR tool;

a soft magnetic core material positioned around the magnet assembly; and an antenna assembly positioned around the soft magnetic core material, wherein:

the magnet assembly comprises a first magnet section and a second magnet section longitudinally separated from one another such that a gap is present there between; and the first and second magnet sections each comprise a first end piece and a second, opposite end piece, wherein the first end pieces are positioned adjacent the gap and have a smaller cross-sectional area or smaller remnant flux density in comparison to the second end pieces.

13. The downhole assembly of claim 12, wherein the soft magnetic core material is comprised of at least one of iron, nickel, or cobalt.

14. The downhole assembly of claim 12, wherein the magnet assembly comprises a conductive magnet.

15. The downhole assembly of claim 12, wherein the downhole assembly a drill string assembly.

16. The downhole assembly of claim 12, wherein the downhole assembly a wireline assembly.

* * * * *